United States Patent [19]
Itozaki et al.

[11] Patent Number: 5,221,660
[45] Date of Patent: Jun. 22, 1993

[54] SEMICONDUCTOR SUBSTRATE HAVING A SUPERCONDUCTING THIN FILM

[75] Inventors: Hideo Itozaki; Keizo Harada; Naoji Fujimori; Shuji Yazu; Tetsuji Jodai, all of Hyogo, Japan

[73] Assignee: Sumitomo Electric Industries, Ltd., Osaka, Japan

[21] Appl. No.: 856,824

[22] Filed: Mar. 25, 1992

Related U.S. Application Data

[63] Continuation of Ser. No. 289,719, Dec. 27, 1988, abandoned.

[30] Foreign Application Priority Data

| Dec. 25, 1987 | [JP] | Japan | 62-328483 |
| Dec. 25, 1987 | [JP] | Japan | 62-328484 |
| Dec. 25, 1987 | [JP] | Japan | 62-328485 |
| Dec. 25, 1987 | [JP] | Japan | 62-328486 |
| Dec. 25, 1987 | [JP] | Japan | 62-328487 |
| Dec. 25, 1987 | [JP] | Japan | 62-328488 |
| Dec. 25, 1987 | [JP] | Japan | 62-328489 |
| Dec. 25, 1987 | [JP] | Japan | 62-328490 |
| Dec. 25, 1987 | [JP] | Japan | 62-328491 |
| Dec. 25, 1987 | [JP] | Japan | 62-328492 |
| Dec. 25, 1987 | [JP] | Japan | 62-328494 |
| Dec. 28, 1987 | [JP] | Japan | 62-328493 |

[51] Int. Cl.$^5$ .................................. H01L 39/12
[52] U.S. Cl. ........................... 505/1; 428/620; 428/446; 505/701; 505/706
[58] Field of Search ............... 428/620, 632, 446, 930; 505/1, 701, 702, 706

[56] References Cited

U.S. PATENT DOCUMENTS

| 4,395,813 | 8/1983  | Roth et al. ......................... 505/922 |
| 4,837,609 | 6/1989  | Gurvitch et al. ................... 505/923 |
| 5,084,437 | 1/1992  | Talvacchio ........................... 505/1 |
| 5,084,438 | 1/1992  | Matsubara et al. .................... 505/1 |

FOREIGN PATENT DOCUMENTS

| 0290357    | 11/1988 | European Pat. Off. ............... 505/1 |
| 304078     | 2/1989  | European Pat. Off. ............. 428/930 |
| 63-244860  | 10/1988 | Japan .................................. 505/703 |
| 63-245973  | 10/1988 | Japan .................................. 505/701 |
| 63-258082  | 10/1988 | Japan .................................. 505/703 |
| 63-275144  | 11/1988 | Japan .................................. 505/701 |
| 63-276243  | 11/1988 | Japan .................................. 505/701 |

OTHER PUBLICATIONS

Kwon et al. "Superconductors as Very High-Speed System Level Intercurrents" IEEE Electron Device Letters, vol. EDL-8, No. 12, Dec. 12, 1987.

Biegel et al. "Use of High-Temperature Superconductors in High Speed" Mat. Res. Soc Symposium proceed, vol. 99 Dec. 4, 1987, pp. 873–876.

*Primary Examiner*—George Wyszomierski
*Attorney, Agent, or Firm*—Kerkam, Stowell, Kondracki & Clarke

[57] ABSTRACT

A semiconductor substrate having a silicon substrate and a superconducting thin film layer composed of compound oxide such as $Ln_1Ba_2Cu_3O_{7-\delta}$ (Ln is lanthanide) and stratified on the silicon substrate, characterized in that an intermediate semiconductor layer composed of compound semiconductor material such as GaAs is interposed between the silicon substrate and the superconducting thin film layer.

10 Claims, 1 Drawing Sheet

SEMICONDUCTOR SUBSTRATE HAVING A SUPERCONDUCTING THIN FILM

This application is a continuation of application Ser. No. 289,719, filed Dec. 27, 1988, now abandoned.

BACKGROUND OF THE INVENTION

1. Field of the Invention

The present invention relates to a semiconductor substrate, more particularly, it relates to a semiconductor substrate having a silicon substrate, an intermediate semiconductor layer composed of compound semiconductor material and deposited on the silicon substrate and a superconducting thin film layer composed of a compound oxide and deposited on the intermediate semiconductor layer.

The superconducting thin film layer of the semiconductor substrate according to the present invention can be used as a wiring material for semiconductor circuits which are built in the silicon substrate and/or in the intermediate semiconductor layer and for fabricating Josephson junctions for Josephson devices.

The combination of the superconducting thin film and the silicon substrate and/or the intermediate semiconductor layer according to the present invention can be used for building superconducting devices such as superconducting transistors, a hot electron transistors or the like.

2. Description of the Related Art

One of the basic technologies for fabricating an integrated circuit on a silicon single crystal substrate is a metallization technology for forming patterned conductor lines which are used for interconnecting a variety of electronic elements which are fabricated by the other basic technology including an insulating layer forming stage, a patterning stage of the insulating layer and an impurity doping stage by means of thermal diffusion, ion implantation or the like. However, a part of the signal current passing through the metallic conductor lines is lost since the cross sectional area of the metallic wiring line become very fine in the case of integrated circuits built on the silicon substrate. Therefore, it is demanded to deliver the signal current without current loss.

It is also demanded to increase the transmission velocity of signal current on the conducting lines in addition to increase the operating velocity of the active elements and passive elements themselves in order to improve the net operating velocity of the integrated circuits. However, the improvement in the transmission velocity of signal current through the conventional metallic conductor lines is limited because of the energy loss in the conducting lines. Still more, the increment in the integration degree lead to increment in power consumption owing to Joule heat which is generated in the metallic conducting lines, in other words, the degree of integration in the integrated circuit is limited. Thus, there have been strong demand to use superconductors as a material for the conductor lines.

The superconductivity is a phenomenon which is explained to be a kind of phase changes of electrons under which the electric resistance become zero and the perfect diamagnetism is observed. However, the critical temperature "Tc" of superconductivity could not exceed 23.2 K. of $Nb_3Ge$ which was the the highest Tc for the past ten years, so that they have not used as a wiring material for ICs.

The possibility of an existence of a new type of superconducting material having much higher Tc was revealed by Bednorz and Müller, who discovered a new oxide type superconductor in 1986 [Z. Phys. B64 (1986) 189].

It had been known that certain ceramic materials of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi-Pb type compound oxides also show superconductivity. These superconductors, however, possess rather lower transition temperatures of about 10 K. and hence usage of liquidized helium (boiling point of 4.2 K.) as cryogen is indispensable to realize superconductivity.

The new type compound oxide superconductor discovered by Bednorz and Müller is represented by [La, Sr]$_2$CuO$_4$ which is called the K$_2$NiF$_4$-type oxide having a crystal structure which is similar to known perovskite type oxides. The K$_2$NiF$_4$-type compound oxides show such higher Tc as 30 K. which are extremely higher than known superconducting materials.

It was also reported that C. W. Chu et al. discovered, in the United States of America, another superconducting material so called YBCO type represented by YBa$_2$Cu$_3$O$_{7-x}$ having the critical temperature of about 90 K. in February 1987. Still other type new superconducting materials which were reported recently are a compound oxide of Bi-Sr-Ca-Cu-O system and Tl-Ba-Ca-Cu-O system which exhibit such high Tc as more than 100 K. and which are chemically much stable than the abovementioned YBCO type compound oxide or the like.

And hence, the possibility of utilization of high-temperature superconductors as the wiring material for the integrated circuits.

The high-temperature superconductors are also demanded in the electronic devices. A typical application of the superconductor for the electronic devices is Josephson device in which quantum efficiency is observed macroscopically when an electric current is passed through a weak junction arranged between two superconductors. The tunnel junction type Josephson device is expected to be a high-speed and low-power consuming switching device owing to smaller energy gap of the superconducting material. It is also expected to utilize the Josephson device as a high sensitive sensor or detector for sensing very weak magnetic field, microwave, radiant ray or the like since variation of electromagnetic wave or magnetic field is reflected in variation of Josephson effect and can be observed as a precise quantum phenomenon. Development of the superconducting devices such as high-speed logic units or zero power loss wiring materials is also demanded in the field of high-speed computers in which the power consumption per unit area is reaching to the upper limit of the cooling capacity with increment of the integration density in order to reduce energy consumption.

Several ideas or concepts of new devices which is constructed by a combination of semiconductor and superconductor such as a superconducting transistor or a hot electron transistor have been proposed (M. Heiblum et al. "Solid State Electronics" Vol. 24, No. 343-346, 1981), but have not yet realized in a form of actual device.

In order to realize the above-mentioned superconducting devices such as the superconducting transistor or hot electron transistor, it is indispensable to prepare such a semiconductor substrate that has a superconducting layer which are stratified or deposited homogeneously on a silicon substrate.

The present applicant already proposed several processes for preparing the thin films of the high-Tc superconductor on oxide substrate in the following patent applications: U.S. patent application Ser. No. 152,714 filed on Feb. 2, 1988, U.S. patent application Ser. No. 167,895 filed on Mar. 13, 1988, U.S. patent application Ser. No. 195,145 filed on May 18, 1988, U.S. patent application Ser. No. 195,147 filed on May 18, 1988, U.S. patent application Ser. No. 200,206 filed on May 31, 1988 or the like.

An object of the present invention is to provide a novel semiconductor substrate having a superconducting layer composed of compound oxide deposited on a silicon substrate through an intermediate semiconductor layer.

SUMMARY OF THE INVENTION

The present invention provides a semiconductor substrate having a silicon substrate and a superconducting thin film layer composed of compound oxide and stratified on the silicon substrate, characterized in that an intermediate semiconductor layer composed of compound semiconductor material is interposed between the silicon substrate and the superconducting thin film layer.

Figure 1:
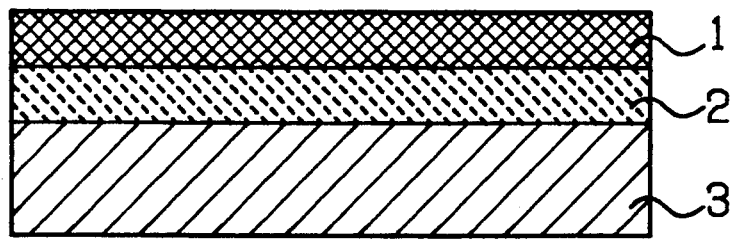
FIG. 1 shows a cross sectional view illustrating a semiconductor substrate according to the present invention.

The semiconductor substrate according to the present invention comprises a silicon substrate 3, an intermediate semiconductor layer 2 deposited on the silicon substrate 3, and a superconducting thin film layer 1 deposited on the intermediate semiconductor layer 2.

The superconducting thin film layer 1 which can be used in the present invention can be any one of compound oxide type superconducting materials.

According to a preferred embodiment of the present invention, the superconducting thin film layer is composed mainly of a compound oxide of at least one element $\alpha$ selected from IIa group of the Periodic Table, at least one element $\beta$ selected from IIIa group of the Periodic Table and at least one element $\gamma$ selected from a group comprising Ib, IIb, IIIb, IVa and VIIIa groups of the Periodic Table.

One example of this type compound oxide is represented by the general formula:

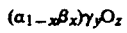

in which $\alpha$, $\beta$ and $\gamma$ have the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively. The element $\alpha$ of IIa group element is preferably Ba, Sr, Ca, Mg, Be or the like. More preferably the element $\alpha$ is Ba and Sr from 10% to 80% of which may be replaced by one or two elements selected from a group comprising Mg and Ca. The element $\beta$ of IIIa group element is preferably lanthanide such as Y, La, Sc, Ce, Gd, Ho, Er, Tm, Yb or Lu. More preferably the element $\beta$ is Y, La or Ho from 10% to 80% of which may be replaced by Sc or one or two elements selected from a group comprising the other lanthanide elements. The $\gamma$ is copper a part of which can be replaced by the other element selected from a group comprising Ib, IIb, IIIb, IVa and VIIIa groups of the Periodic Table such as Ti or V. Particularly, the superconducting thin film of this type compound oxide is preferably a compound oxide preferably represented by the general formula:

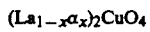

in which $\alpha$ stands for Ba or Sr. These compound oxides are considered to be composed mainly of perovskite type or oxygen deficient perovskite type crystalline structure.

Another example of the above-mentioned compound oxide is a so called YBCO type compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er, Yb, Tm and Lu and $\delta$ is a number which satisfies a range of $0 \leq \delta < 1$. Namely this type compound oxide are following systems:

| | | |
|---|---|---|
| $Y_1Ba_2Cu_3O_{7-\delta}$, | $Ho_1Ba_2Cu_3O_{7-\delta}$, | $Lu_1Ba_2Cu_3O_{7-\delta}$, |
| $Sm_1Ba_2Cu_3O_{7-\delta}$, | $Nd_1Ba_2Cu_3O_{7-\delta}$, | $Gd_1Ba_2Cu_3O_{7-\delta}$, |
| $Eu_1Ba_2Cu_3O_{7-\delta}$, | $Er_1Ba_2Cu_3O_{7-\delta}$, | $Dy_1Ba_2Cu_3O_{7-\delta}$, |
| $Tm_1Ba_2Cu_3O_{7-\delta}$, | $Yb_1Ba_2Cu_3O_{7-\delta}$, | $La_1Ba_2Cu_3O_{7-\delta}$ | in which $\delta$ is a number which satisfies a range of $0 < \delta < 1$ and possess preferably perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

An atomic ratio of the lanthanide element "Ln":Ba:Cu is preferably 1:2:3 as is defined by the formula but the atomic ratio is not restricted strictly to this ratio. In fact, the other compound oxides having different atomic ratios which are deviate from the above-mentioned value by 10% may exhibit superconducting property.

Still another example of the above-mentioned compound oxide is compound oxides represented by the general formula:

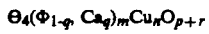

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satisfies a range of $-2 \leq r \leq +2$. Namely, this type compound oxide include the following systems:

| | |
|---|---|
| $Bi_4Sr_4Ca_4Cu_6O_{20-r}$ | $Bi_2Sr_2Ca_2Cu_3O_{10-r}$ |
| $Tl_4Ba_4Ca_4Cu_6O_{20-r}$ | $Tl_2Ba_2Ca_2Cu_3O_{10-r}$ | in which r is a number which satisfies a range of $-2 \leq r \leq +2$.

According to the present invention, the intermediate semiconductor layer is composed of compound semiconductor material. The compound semiconductor material is preferably selected from a group comprising SiC, GaAs, GaP, InP, InSb, ZnSe, CdTe, HgCdTe, GaAlAs, GaInAs, InAlAs and InGaAsP.

Now, we will describe a process for producing the above-mentioned semiconductor substrate according to the present invention.

At first, the intermediate semiconductor layer is deposited on a silicon substrate. The deposition of the intermediate semiconductor layer can be effected by a known technique such as CVD, MBE, epitaxy technique or the like.

According to a preferred embodiment of the present invention, the semiconductor layer is deposited by the conventional chemical vapour deposition (CVD) technique on substrate.

Then, the superconducting thin film layer is deposited on the intermediate semiconductor layer by physical vapour deposition (PVD) technique such as sputtering, vacuum-deposition, molecular beam epitaxy (MBE), ion beam deposition or the like or by chemical vapour deposition (CVD) technique such as thermal CVD, plasma CVD, photo CVD, MOCVD or the like. Among the physical vapour deposition (PVD) technique, magnetron sputtering is most preferable.

The deposited thin film is preferably further heat-treated in oxygen-containing atmosphere or exposed to oxygen plasma in order to adjust the oxygen contents to a proper concentration in the crystalline structure of which the superconducting thin film is composed. In either case, the deposition of the superconducting thin film layer should be operated carefully in order not to spoil the properties of the intermediate semiconductor layer on which the superconducting thin film layer is deposited. In this sense, the substrate temperature during the deposition of the superconducting thin film should be lower than 700° C. and should not be heated to unnecessarily high temperatures during the above-mentioned after-treatment.

When electronic systems or semiconductor devices are fabricated in the silicon substrate or in the intermediate semiconductor layer according to the present invention, the superconducting thin film layer can be removed locally by etching technique or the like so that the superconducting thin film layer is shaped into a desired pattern.

The superconducting thin film layer of the semiconductor substrate according to the present invention can be used as a wiring material for semiconductor circuits which are built in the silicon substrate and/or in the intermediate semiconductor layer.

The semiconductor substrate according to the present invention can be used also as a substrate for fabricating an integrated circuit for building novel superconducting elements or as a substrate on which electronic devices are built. For example, Josephson junctions can be fabricated in the superconducting thin film to built Josephson devices. The semiconductor substrate according to the present invention can be used also for fabricating high-speed semiconductor devices such as superconducting transistors having more than three electrodes, superconducting FETs or hot electron transistors which utilized the interface between the superconducting thin film layer and the semiconductor.

In conclusion, the superconducting substrate is expected to accelerate technology for improving the operating velocity of semiconductor devices and for increasing the degree of integration.

Now, the present invention will be described with reference to examples, but the scope of the present invention should not be limited thereto.

EXAMPLE 1

Two semiconductor substrate samples each having a stratified structure as is shown in FIG. 1 according to the present invention are prepared by depositing two superconducting thin film layers of Y-Ba-Cu-O system and Ho-Ba-Cu-O system on an intermediate semiconductor layer of GaAs.

At first, an intermediate semiconductor layer of GaAs having a thickness of 2,000 Å is deposited on a silicon substrate by the MOCVD method under the following conditions:
Source gases: TMG and $AsH_3$
Substrate temperature: 650° C.
Deposition rate: 300 Å/min Then, each of two superconducting thin films is deposited on the resulting intermediate semiconductor layer of GaAs by magnetron RF sputtering technique which is itself known. Targets used in the sputtering are sintered powder of $YBa_2Cu_{4.5}O_x$ for Y-Ba-Cu-O system and $HoBa_{2.5}Cu_{4.7}O_x$ for Ho-Ba-Cu-O system respectively. Special attention is paid to the distance between the substrate and the target and to the power of high-frequency, while the silicon substrate is heated at 700° C. during the sputtering operation so that superconducting thin film layers of the respective compound oxides are grown to 1,000Å.

The resulting samples of semiconductor substrates having the superconducting thin film layer show good condition at an interface between the semiconductor layer and the superconducting thin film layer. Table 1 shows the critical temperature Tco (a temperature where the phenomenon of superconductivity start to be observed) and Tci (a temperature where zero resistance is observed) of the superconducting thin films on the respective samples.

TABLE 1

| Superconducting thin film | Critical temperature (K) | |
|---|---|---|
| | Tco | Tci |
| Y—Ba—Cu system | 93 | 91 |
| Ho—Ba—Cu system | 95 | 92 |

EXAMPLE 2

The same operation as Example 1 is repeated except that the intermediate semiconductor layer of GaAs is replaced by SiC, GaP, InP, InSb, ZnSe, CdTe, HgCdTe, GaAlAs, GaInAs, InAlAs and InGaAsP respectively to prepare each two semiconductor substrate samples according to the present invention.

Each intermediate semiconductor layer of these compound semiconductor materials is deposited until a thickness of 2,000Å on the respective superconducting thin film layers by the MOCVD method by using organometals as source gases under the same condition as Example 1.

The resulting semiconductor substrates having the respective superconducting thin film layers deposited on silicon substrate through respective intermediate semiconductor layers show good conditions at the interface between the semiconductor layer and the superconducting thin film layer. Table 2 shows the critical temperature Tco and Tci of the superconducting thin films on the respective samples.

TABLE 2

| Superconducting thin film | Intermediate semiconductor layer | Critical temperature |  |
|---|---|---|---|
|  |  | Tco (K) | Tci (K) |
| Y—Ba—Cu system | SiC | 94 | 92 |
|  | GaP | 92 | 90 |
|  | InP | 95 | 92 |
|  | InSb | 89 | 87 |
|  | ZnSe | 91 | 88 |
|  | CdTe | 90 | 87 |
|  | HgCdTe | 91 | 87 |
|  | GaAlAs | 87 | 85 |
|  | GaInAs | 93 | 90 |
|  | InAlAs | 85 | 82 |
|  | InGaAsP | 90 | 85 |
| Ho—Ba—Cu system | SiC | 96 | 93 |
|  | GaP | 95 | 91 |
|  | InP | 97 | 94 |
|  | InSb | 90 | 88 |
|  | ZnSe | 93 | 90 |
|  | CdTe | 88 | 85 |
|  | HgCdTe | 92 | 89 |
|  | GaAlAs | 89 | 86 |
|  | GaInAs | 94 | 92 |
|  | InAlAs | 88 | 86 |
|  | InGaAsP | 91 | 88 |

EXAMPLE 3

The same operation as Example 1 is repeated except that a superconducting thin film of Bi-Sr-Ca-Cu-O system is deposited on the intermediate semiconductor layer of GaAs in place of Y-Ba-Cu-O system and Ho-Ba-Cu-O system used in Example 1 by using a target of $Bi_{1.4}Sr_1Ca_1Cu_{1.5}O_x$ The resulting semiconductor substrate having the superconducting thin film layer of Bi-Sr-Ca-Cu-O system on the intermediate semiconductor layer of GaAs deposited on silicon substrate shows good condition at the interface between the semiconductor layer and the superconducting thin film layer. Table 3 shows the critical temperature Tco and Tci of the superconducting thin film.

TABLE 3

| Substrate | Superconducting thin film | Critical temperature (K) | |
|---|---|---|---|
|  |  | Tco | Tci |
| MgO | Bi—Sr—Ca—Cu system | 115 | 102 |

We claim:
1. A semiconductor substrate structure comprising:
a silicon substrate;
a superconducting thin film layer composed of compound oxide;
an intermediate semiconductor layer interposed between said silicon substrate and said superconducting thin film layer, a first side of said intermediate semiconductor layer being in contact with said substrate and a second side of said intermediate semiconductor layer being in contact with said superconducting thin film layer, wherein said intermediate semiconductor layer comprises a compound semiconductor material, and wherein said compound semiconductor material is selected from a group consisting of SiC, GaAs, GaP, InP, InSb, ZnSe, CdTe, HgCdTe, GaAlAs, GaInAs, InAlAs, and InGaAsP.

2. A semiconductor substrate set forth in claim 1, characterized in that said superconducting thin film layer is composed of a compound oxide of at least one element α selected from IIa group of the Periodic Table, at least one element β selected from IIIa group of the Periodic Table and at least one element γ selected from a group comprising Ib, IIb, IIIb, IVa and VIIIa groups of the Periodic Table.

3. A semiconductor substrate set forth in claim 2, characterized in that said superconducting thin film layer is composed mainly of a compound oxide represented by the general formula:

$$(\alpha_{1-x}\beta_x)\gamma_y O_z$$

in which α, β and γ have the same definition as above, x is an atomic ratio of β with respect to (α+β) and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

4. A semiconductor substrate set forth in claim 3, characterized in that said superconducting thin film layer is composed of a compound oxide represented by the general formula:

$$(La_{1-x}\alpha_x)_2CuO_4$$

in which α stands for Ba or Sr.

5. A semiconductor substrate set forth in claim 2, characterized in that said superconducting thin film layer is composed of an oxide having perovskite or oxygen deficient perovskite crystalline structure.

6. A semiconductor substrate set forth in claim 2, characterized in that said superconducting thin film layer is composed mainly of a compound oxide represented by the general formula:

$$Ln_1Ba_2Cu_3O_{7-\delta}$$

in which Ln stands for at least one lanthanide element selected from the group consisting of La, Nd, Sm, Eu, Gd, Dy, Ho, Y, Er, Yb, Tm and Lu and δ is a number which satisfies a range of $0 \leq \delta < 1$.

7. A semiconductor substrate set forth in claim 6, characterized in that the Ln is Y, Er, Ho or Dy.

8. A semiconductor substrate set forth in claim 6, characterized in that said compound oxide contain further at least one of element selected from the group consisting of Al, Fe, Co, Ni, Zn, Ag and Ti.

9. A semiconductor substrate set forth in claim 2, characterized in that said superconducting thin film layer is composed mainly of a compound oxide represented by the general formula:

$$\Theta_q(\Phi_{1-q}Ca_q)_m Cu_n O_{p+r}$$

in which Θ stands for Bi or Tl, Φ stands for Sr when Θ is Bi and stands for Ba when Θ is Tl, m and n are numbers each satisfying ranges of $6 \leq m \leq 10$ and $4 \leq n \leq 8$ respectively, p=(6+m+n), q is a number which satisfies a range of $0 < q < 1$, and r is a number which satisfies a range of $-2 \leq r \leq +2$.

10. A semiconductor substrate structure comprising:
a silicon substrate;
a superconducting thin film layer composed of compound oxide; and an intermediate semiconductor layer interposed between said silicon substrate and said superconducting thin film layer, a first side of said intermediate semiconductor layer being in contact with said substrate and a second side of said intermediate semiconductor layer being in contact with said superconducting thin film layer, and wherein said intermediate semiconductor layer comprises a compound semiconductor material, wherein said superconducting thin film layer is composed of a compound oxide of at least one element $\alpha$ selected from the IIa group of the Periodic Table, at least one element $\beta$ selected from the IIIa group of the Periodic Table and at least one element $\gamma$ selected from the group consisting of Ib, IIb, IIIb, IVa and VIIIa groups of the Periodic Table and wherein said superconducting thin film layer is composed mainly of a compound oxide represented by the general formula:

$$\theta_4(\Phi_{1-q}Ca_q)_m Cu_n O_{p+r}$$

in which $\theta$ stands for Bi or Tl, $\Phi$ stands for Sr when $\theta$ is Bi and stands for Ba when $\theta$ is Tl, m and n are numbers each satisfying ranges of $6 \leq m \leq 10$ and $4 \leq n \leq 8$ respectively, $p=(6+m+n)$, $\Phi$ is a number which satisfies a range of $0<q<1$, and r is a number which satisfies a range of $-2 \leq r \leq +2$, and wherein $\Theta$ is Bi, $\Phi$ is Sr, and wherein said compound semiconductor material of said intermediate semiconductor layer is GaAs.

* * * * *

UNITED STATES PATENT AND TRADEMARK OFFICE
CERTIFICATE OF CORRECTION

PATENT NO. : 5,221,660

DATED : June 22, 1993

INVENTOR(S) : Hideo Itozaki, Et al

It is certified that error appears in the above-identified patent and that said Letters Patent is hereby corrected as shown below:

Col. 10, line 10, (Claim 10) " $\Phi$ " should be -- q --.

Signed and Sealed this

Twelfth Day of July, 1994

Attest:

BRUCE LEHMAN

Attesting Officer    Commissioner of Patents and Trademarks